Figure 1:
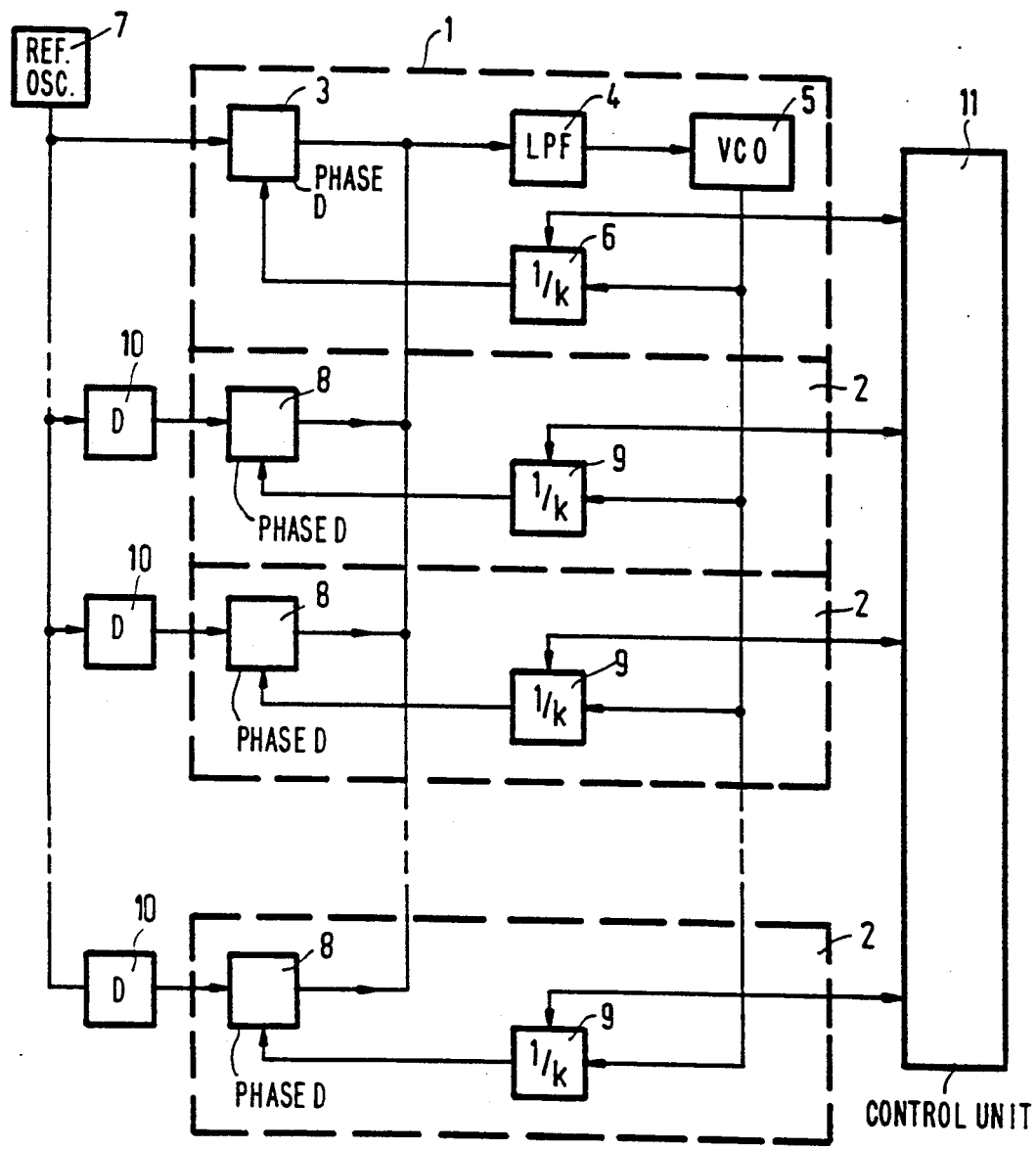

United States Patent [19]

Wünsch

[11] Patent Number: 5,254,959
[45] Date of Patent: Oct. 19, 1993

[54] FREQUENCY SYNTHESIZER HAVING PHASE CONTROL LOOP WITH PLURAL BRANCHES

[75] Inventor: Christian Wünsch, Rötenbach/Pegnitz, Fed. Rep. of Germany

[73] Assignee: U.S. Philips Corporation, New York, N.Y.

[21] Appl. No.: 904,794

[22] Filed: Jun. 26, 1992

[30] Foreign Application Priority Data

Jun. 28, 1991 [DE] Fed. Rep. of Germany ....... 4121361

[51] Int. Cl.$^5$ ...................... H03L 7/087; H03L 7/191
[52] U.S. Cl. ...................................... 331/12; 331/14; 331/25
[58] Field of Search ................. 331/10, 11, 12, 14, 331/25

[56] References Cited

U.S. PATENT DOCUMENTS

| | | | |
|---|---|---|---|
| 3,571,743 | 3/1971 | Menkes | 331/11 |
| 4,697,156 | 9/1987 | Rudolph | 331/1 A |
| 4,800,342 | 1/1989 | Jackson | 331/10 |
| 4,888,564 | 12/1989 | Ishigaki | 331/12 X |
| 4,912,432 | 3/1990 | Galani et al. | 331/2 |

Primary Examiner—Siegfried H. Grimm
Attorney, Agent, or Firm—Leroy Eason

[57] ABSTRACT

The invention relates to a circuit arrangement for frequency synthesis with a phase control circuit (1) which comprises a first phase discriminator (3) for receiving a reference signal and an output signal supplied by a first frequency divider (6) with a division ratio k, a low-pass filter (4) coupled to the output of the first phase discriminator (3), and an oscillator (5) coupled to the output of the low-pass filter (4) for generating an output signal which can be supplied to the first frequency divider (6). At least one further branch (2) with a further phase discriminator (8) and a further frequency divider (9) which is to be released and which has a division ratio k is present. The further phase discriminator (8) coupled to the input of the low-pass filter (4) is designed for receiving the reference signal delayed by a delay element (10) and the output signal of the further frequency divider (9) provided for receiving the output signal of the oscillator (5). Each delay element (10) has a different delay time corresponding to a fraction of a period $T=1/(n*f_{ref})$ of the reference signal, n being the number of branches (1,2) and $f_{ref}$ being the frequency of the reference signal. A control unit (11) releases the frequency divider (9) approximately after the delay time of the delay element (10) assigned to the relevant frequency divider (9).

20 Claims, 3 Drawing Sheets

FREQUENCY SYNTHESIZER HAVING PHASE CONTROL LOOP WITH PLURAL BRANCHES

The invention relates to a circuit arrangement for frequency synthesis comprising a phase control loop which includes a first phase discriminator for receiving a reference signal and an output signal supplied by a first frequency divider with a division ratio k, a low-pass filter coupled to the output of the first phase discriminator, and an oscillator coupled to the output of the low-pass filter for generating an output signal which can be supplied to the first frequency divider.

Such a circuit arrangement comprising a voltage-controlled oscillator, a low-pass filter, a variable digital frequency divider, a phase discriminator and a stable reference oscillator which makes the reference frequency available is particularly suitable for indirect frequency synthesis. In this case, the frequency divider brings the frequency of the oscillator output signal into the order of magnitude of the reference oscillator, and the phase discriminator sends control pulses depending on the phase or frequency error to the low-pass filter which converts these pulses into a control voltage, suppresses higher-frequency components and supplies the control voltage to the oscillator. As a result, the phase and the frequency of the oscillator are controlled, so that this oscillator assumes the long-term stability and, within certain limitations, also the short-term stability of the reference oscillator.

Simple circuit arrangements of this kind, which have variable frequency dividers with integer division factors in the feedback line, have a few disadvantages. Thus the frequency of the output signal of the oscillator is an integer multiple of the frequency of the reference signal, which leads of necessity to low reference frequencies in the case of small frequency steps, which are often desirable, especially in the case of a fine frequency raster of the oscillator output signal. Increasing division factors lead to an increasing deterioration of the phase noise of the output signal frequency of the oscillator within the control bandwidth. In addition, small frequencies of the reference signal necessitate small control bandwidths, which cause the control loop to become slow, whereby quick frequency changes, which are increasingly required, with small desired frequency steps become impossible in this technology.

To eliminate this conflicting situation, several solutions are known. Thus several phase control circuits are coupled to one another by means of mixers, so that the loop which mainly determines the characteristics works with a comparatively high reference signal frequency (Manassewitsch, V.: "Frequency Synthesizer", John Wiley & Sons, 1987, 3rd edition, pp. 308 ff; EP-A1-0 393 975). With this measure, the addition of the mixers renders an increase in the high-frequency technology equipment necessary, since corresponding sideband filters become necessary.

A further modification involves the use of fractional frequency dividers with which it is possible to set the output signal frequency of the oscillator for a noninteger multiple of the reference signal frequency (U.S. Pat. No. 3 959 737). In this case the division ratio of the frequency divider is varied in such a manner between K and K+1 that the desired frequency of the output signal is obtained averaged over time. The manipulation of the division ratios leads to phase disturbances, which, however, are predictable, so that they can be suppressed to a greater or smaller degree in dependence on the measures taken for this purpose (Hersman, R.: "Durchbruch bei der rauscharmen Frequenzsynthese" (Breakthrough in low-noise frequency synthesis), elektronik industrie, vol. 22, no. 5, pp. 32-37; WO 86/05045; DE-A1-35 44 371). The phase disturbances of the oscillator output signal inherent in the principle are to be compensated by means which are partly very costly.

It is an object of the invention to provide a circuit arrangement for frequency synthesis of the kind mentioned in the opening paragraph with which the control speed and the phase noise within the control bandwidth is improved as compared with a simple phase control circuit without phase control circuits comprising mixers or fractional dividers.

This object is achieved by a circuit arrangement of the kind mentioned in the opening paragraph in that at least one further branch is present with one further phase discriminator and one further frequency divider with a divider with a division ratio k, which further freqency divider is to be released, in that the further phase discriminator coupled to the input of the low-pass filter is designed for receiving the reference signal delayed by a delay element and the output signal of the further frequency divider provided for receiving the oscillator output signal, in that each delay element has a different delay time corresponding to a fraction of a period $T = 1/(n*f_{ref})$ of the reference signal, n being the number of branches and $f_{ref}$ being the frequency of the reference signal, and in that a control signal for releasing the frequency divider is provided approximately after the delay time of the delay element assigned to the relevant frequency divider.

In the circuit arrangement according to the invention, at least one further branch with a second phase discriminator and a second divider is added to the phase control circuit (or first branch). The reference signal is supplied to the second phase discriminator with a delay, and the second divider is released after a given delay time. The delay time of the delay element corresponds to half the period of the reference signal in the case of only one single second branch. The second divider is released approximately after the delay time of the delay element. Only then can the frequency-divided output signals of the oscillator be admitted to the second phase discriminator. Owing to the measures according to the invention, more control pulses are supplied to the low-pass filter and thus to the oscillator. The result of this is that the control speed and the phase noise are improved, provided that the frequency of the reference signal and also the frequency step width are maintained as compared with the simple phase control circuit. A phase control circuit with mixers and fractional dividers is not necessary according to the invention.

When four branches are used, for example, the delay time of the second delay element is one quarter of the period of the reference signal, the delay time of the third delay element is half the period, and the delay time of the fourth branch is three quarters of the period of the reference signal. The second, third and fourth branch each comprise a phase discriminator and a frequency divider. The first phase discriminator, the low-pass filter, the oscillator, and the first frequency divider form the first branch. Each delay element accordingly has a different delay time. The delay time is calculated from a subperiod $T = 1/(n*f_{ref})$. n here is the number of branches and $f_{ref}$ the frequency of the reference signal. The first branch, therefore, is not delayed at all, the second branch by one subperiod, the third branch by two subperiods, and the n$^{th}$ branch by n-1 subperiods. One period of the reference signal is defined as the duration of one pulse and one pause between pulses. The frequency dividers of the further branches are released approximately after the delay time of the delay element assigned to the relevant frequency divider.

In a digital version of the circuit arrangement for frequency synthesis, a frequency divider comprises at least one counter. The maximum counter position of such a divider corresponds to the division ratio k. If variable frequency dividers are used, this counter position can be set at will.

In a further embodiment of the control it is provided that the control comprises at least one comparator for generating a release signal for the relevant frequency divider (6-9) when the contents of the counter in the frequency divider (6,9) exceeds a predetermined value. The release signal is generated when the contents of the counter in the frequency divider exceed a programmable value. In the case of two branches, this programmable value corresponds to half the division ratio k.

In a further, simple embodiment of the control, comprising two branches with two phase discriminators, it is ensured that the control comprises two D-flipflops, that the clock input of the first D-flipflop receives the reference signal and the clock input of the second D-flipflop receives the delayed reference signal, that an output of the first D-flipflop is coupled to the D-input of the second D-flipflop, and that an output of the second D-flipflop supplies the release signal.

A reduction of the phase noise is achieved in that the phase discriminators are coupled to the low-pass filter via an alternating switch. Only one phase discriminator is coupled to the low-pass filter at any time in this way. The alternating switch may be controlled by means of the reference signals supplied to the phase discriminators.

The cost of the frequency dividers can be reduced when the frequency dividers can be realised in the form of at least two frequency dividers connected in series. This is achieved in that the output of the oscillator is coupled to an input of an auxiliary frequency divider whose output is coupled to the inputs of the frequency dividers. The division ratio of the frequency dividers must be at least equal to the number of branches in the circuit arrangement for frequency synthesis.

Figure 2:
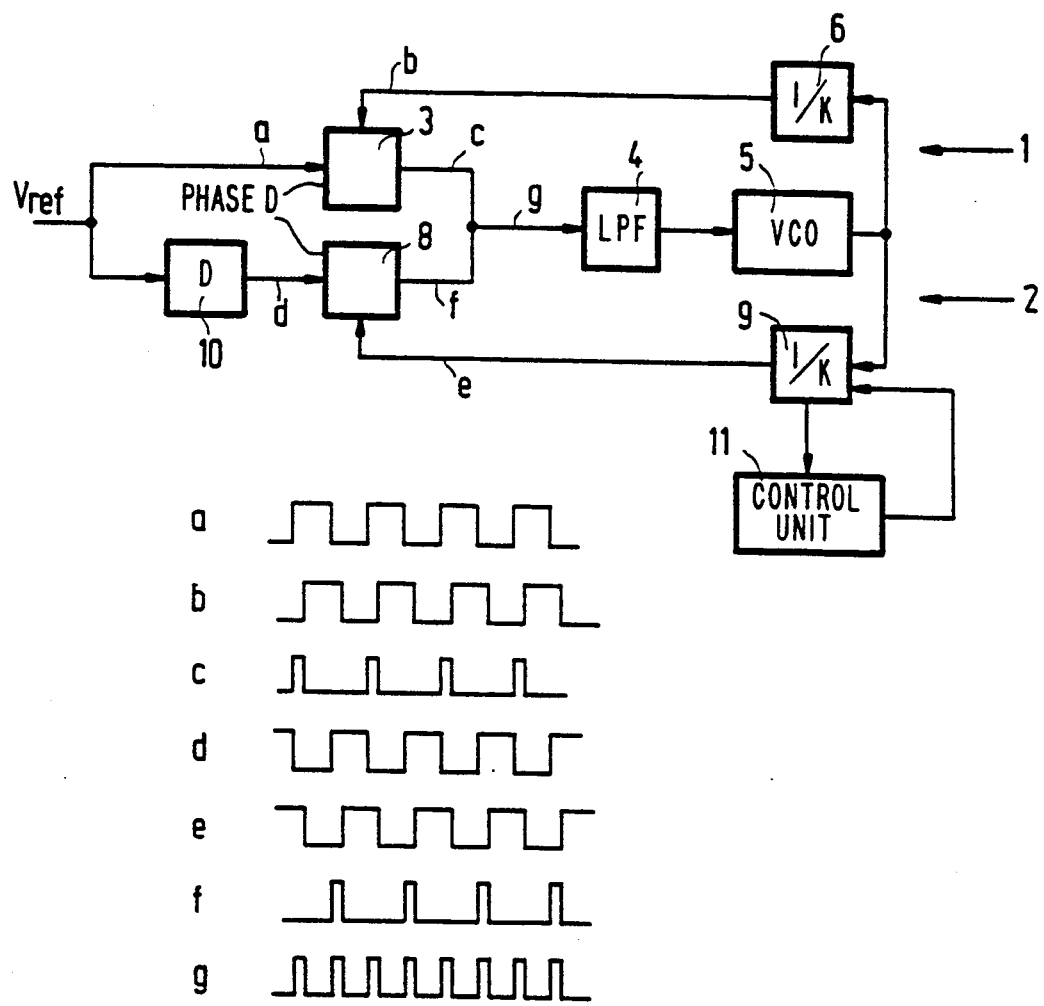
Figure 3:
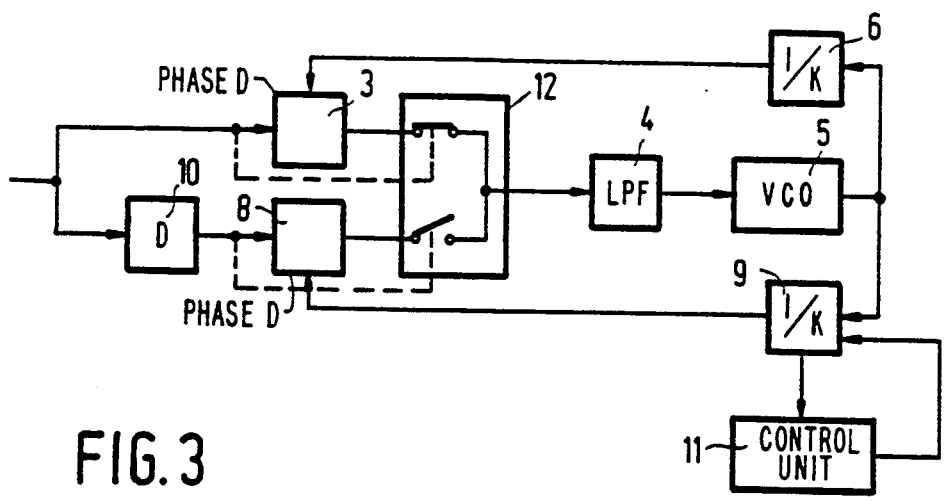
Figure 4:
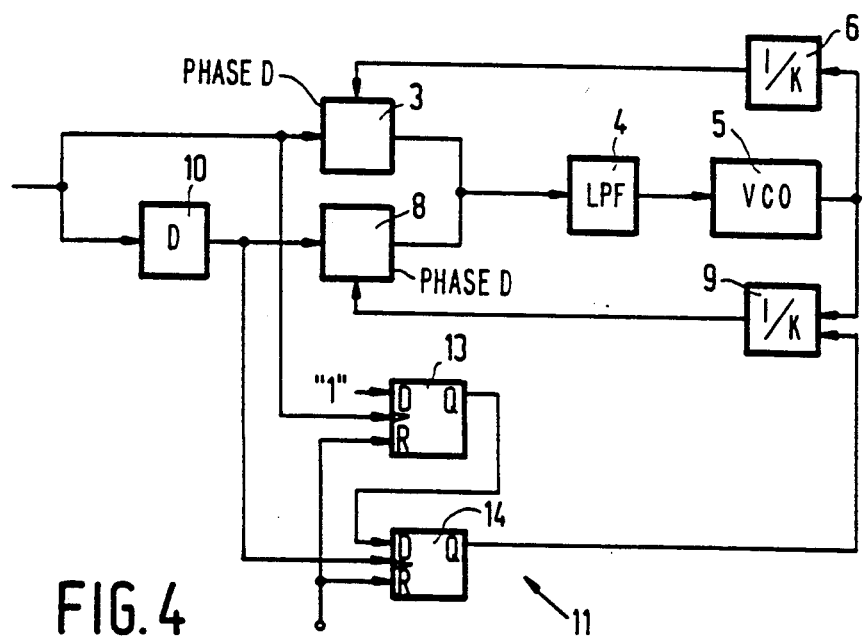
Figure 5:
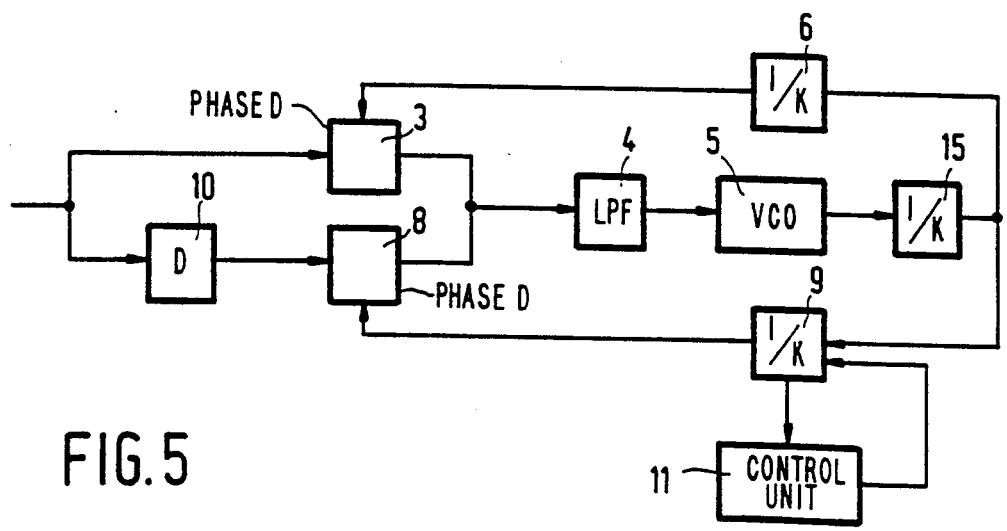

Embodiments of the invention are explained in more detail below with reference to the Figures, in which:

FIG. 1 is a diagram of a first, general embodiment of the circuit arrangement for frequency synthesis, FIG. 2 shows a further embodiment of the circuit arrangement for frequency synthesis comprising two branches, FIG. 3 shows the embodiment of the circuit arrangement according to FIG. 2 with an alternating switch, FIG. 4 shows the embodiment of the circuit arrangement according to FIG. 2 with a control unit shown in detail, and FIG. 5 shows an embodiment of the circuit arrangement according to FIG. 2 with an auxiliary frequency divider.

The first embodiment of the circuit arrangement for frequency synthesis according to the invention, which is kept in general terms in FIG. 1, comprises a first branch 1 and further n-1 branches 2. The first branch 1 comprises a phase discriminator 3, a low-pass filter 4, a voltage-controlled oscillator 5, and a frequency divider 6, possibly adjustable, with a division factor k. The phase discriminator 3 receives a reference signal from a reference oscillator 7 and the output signal of the frequency divider 6. The output signal of the phase discriminator 3 is provided to the voltage-controlled oscillator 5 via the low-pass filter 4. Each of the further branches 2 comprises a further phase discriminator 8 and a further frequency divider 9. Each phase discriminator 8 receives the reference signal through a delay element 10 and compares this signal with the output signal supplied by the relevant frequency divider 9. The output of each phase discriminator 8 is connected to the input of the low-pass filter 4. The output of the oscillator 5 is coupled to the input of the frequency dividers 6 and 9. The reference signal from the reference oscillator 7 is also supplied to the relevant delay elements 10.

A control unit 11 which releases the frequency divider 9 is present, so that the output signal supplied by the oscillator can be provided to the phase discriminators 8 in frequency-divided form. Each delay element 10 has a different delay time corresponding to a fraction of a period of the reference signal. Each period of the reference signal is divided into n subperiods, n being the number of branches 1 and 2 present. A subperiod can be calculated from the following equation: $T = 1/(n \cdot f_{ref})$, in which $f_{ref}$ is the frequency of the reference signal. Thus a first delay element 10 will delay the reference signal received from the reference oscillator 7 by one subperiod, a further delay element by two subperiods, and the delay element 10 in the n$^{th}$ branch by n-1 subperiods. The frequency dividers 9, which also have a division ratio k, are released approximately after the delay time of the delay element assigned to the relevant frequency divider 9. The control unit 11 accordingly releases the frequency dividers 9 one after the other with intervals of approximately one subperiod.

To clarify the operation of the embodiment of FIG. 1, the circuit arrangement with two branches pictured in FIG. 2 is explained in more detail below. The first branch of the circuit arrangement of FIG. 2 comprises in the first branch 1 again the phase discriminator 3, the low-pass filter 4, the oscillator 5, and the frequency divider 6. The second branch comprises a phase discriminator 8 and a frequency divider 9. The frequency dividers 6 and 9 may be constructed as counters to which the division ratio k can be fed externally as a maximum counter value. The delay element 10 is connected upstream of the phase discriminator 8. The reference singal V$_{ref}$ is supplied to the phase discriminator 3 and the delay elements 10. This signal and the subsequent signals are shown in more detail in the time diagram also shown in FIG. 2. The reference signal V$_{ref}$ is referenced as signal a in this time diagram. The signal b is supplied by the frequency divider 6. The phase discriminator 3 forms from this the signal c which is supplied to the oscillator 5 through the low-pass filter. The reference signal V$_{ref}$ is delayed by half a period in the delay element 10. The output signal of the delay element 10 is shown as signal d in the time diagram. This is applied to the phase discriminator 8, which forms the signal f therefrom. A further signal received by the phase discriminator 8 is the signal e from the frequency divider 9. The superimposed signals c and f result in the signal g, which is supplied to the low-pass filter 4. As is evident from the time diagram, a double number of control pulses for the low-pass filter 4 is contained in signal g. As a result, the phase noise and the control time are improved compared with a low-pass filter having only a single loop. The control unit 11 releases the divider 9 after a half period of the reference signal, which divider then generates an output signal which is supplied to the phase discriminator 8. This release is effected at the start or at a frequency change (division ratio k is changed) of the circuit arrangement according to the invention.

The control unit 11 in FIG. 2 may comprise a comparator which compares the contents of the frequency divider 9 constructed as a counter with half the division ratio k. When the counter contents of the frequency divider 9 exceeds the ratio k/2, a release signal for the frequency divider 9 is generated.

Compared with the embodiment of FIG. 2, the embodiment of FIG. 3 comprises an additional alternating switch 12 which receives the output signals of the phase discriminators 3 and 8 and supplies an input signal to the low-pass filter. This alternating switch 12 in turn supplies the output signal of the phase discriminator 3 and of the phase discriminator 8 to the low-pass filter 4. This alternating switch 12 may be controlled, for example, by the positive edges of the reference signal and of the delayed reference signal. The switches in the alternating switch 12 are opened each time by a negative edge of the reference signal and of the delayed reference signal.

The embodiment of FIG. 4 differs from that of FIG. 2 by a detailed representation of the control unit 11. The control unit 11 comprises two D-flipflops 13 and 14. The clock input of the first D-flipflop 13 is connected to the input of the phase discriminator 3, and the clock input of the second D-flipflop 14 is connected to the input of the phase discriminator 8. In addition, a logic "1" is supplied to the D-input of the first D-flipflop 13. The non-inverting output (Q) of the D-flipflop 13 is connected to the D-input of the second D-flipflop 14. The frequency divider 9 is released with the falling edge of the signal a (FIG. 2). The release signal in this case comprises a logic "1". Before the release, the two D-flipflops 13 and 14 should be reset by a signal at their reset inputs which can be provided externally. The frequency dividers 6 and 9 used in this embodiment are not adjustable.

The embodiment of FIG. 5 differs from that of FIG. 2 by an additional auxiliary frequency divider 15. This auxiliary frequency divider 15 can divide the output signal of the oscillator 5 as to its frequency before this signal is supplied to the frequency dividers 6 and 9. The frequency dividers 6 and 9 as a result can be realised in a less expensive manner. The ratio k of the frequency dividers 6 and 9, however, must not be smaller than the number of branches of the circuit arrangement. In the present example, the division ratio of the frequency dividers 6 and 9 should accordingly be at least 2.

I claim:

1. A circuit arrangement for frequency synthesis comprising a phase control loop (1) which includes
    a first phase discriminator (3) for receiving a reference signal and an output signal supplied by a first frequency divider (6) with a division ratio k,
    a low-pass filter (4) coupled to the output of the first phase discriminator (3), and
    an oscillator (5) coupled to the output of the low-pass filter (4) for generating an output signal which can be supplied to the first frequency divider,
    characterized in that
    at least one further branch (2) is present with a further phase discriminator (8) and a further frequency divider (9) with a division ratio k, which further frequency divider is to be released,
    in that the further phase discriminator (8) coupled to the input of the low-pass filter (4) is designed for receiving the reference signal delayed by a delay element (10) and the output signal of the further frequency divider (9) provided for receiving the oscillator (5) output signal,
    in that each delay element (10) has a different delay time corresponding to a fraction of a period $T=1/(n*f_{ref})$ of the reference signal, n being the number of branches (1,2) and $f_{ref}$ being the frequency of the reference signal, and
    in that a release signal for releasing the frequency divider (9) is provided by a control (11) approximately after the delay time of the delay element (10) assigned to the relevant frequency divider (9).

2. A circuit arrangement as claimed in claim 1, characterized in that a frequency divider (6,9) comprises at least one counter.

3. A circuit arrangement as claimed in claim 2, characterized in that the control (11) comprises at least one comparator for generating a release signal for the relevant frequency divider (6,9) when the contents of the counter in the frequency divider (6,9) exceed a predetermined value.

4. A circuit arrangement as claimed in claim 1, characterized in that, in the case of two branches (1,2) with two phase discriminators (3,8), the control (11) comprises two D-flipflops (13,14),
    in that the clock input of the first D-flipflop (13) receives the reference signal and the clock input of the second D-flipflop (14) receives the delayed reference signal, in that an output of the first D-flipflop (13) is coupled to the D-input of the second D-flipflop (14), and
    in that an output of the second D-flipflop (14) supplies the release signal.

5. A circuit arrangement as claimed in claim 1, characterized in that the phase discriminators (3,8) are coupled to the low-pass filter (4) via an alternating switch (12).

6. A circuit arrangement as claimed in claim 1, characterized in that the output of the oscillator (5) is coupled to an input of an auxiliary frequency divider (15) whose output is coupled to the inputs of the frequency dividers (6,9).

7. A circuit arrangement as claimed in claim 3, characterized in that, in the case of two branches (1,2) with two phase discriminators (3,8), the control (11) comprises two D-flipflops (13,14), in that the clock input of the first D-flipflop (13) receives the reference signal and the clock input of the second D-flipflop (14) receives the delayed reference signal, in that an output of the first D-flipflop (13) is coupled to the D-input of the second D-flipflop (14), and in that an output of the second D-flipflop (14) supplies the release signal.

8. A circuit arrangement as claimed in claim 2, characterized in that, in the case of two branches (1,2) with two phase discriminators (3,8), the control (11) comprises two D-flipflops (13,14), in that the clock input of the first D-flipflop (13) receives the reference signal and the clock input of the second D-flipflop (14) receives the delayed reference signal, in that an output of the first D-flipflop (13) is coupled to the D-input of the second D-flipflop (14), and in that an output of the second D-flipflop (14) supplies the release signal.

9. A circuit arrangement as claimed in claim 8, characterized in that the phase discriminators (3,8) are coupled to the low-pass filter (4) via an alternating switch (12).

10. A circuit arrangement as claimed in claim 7, characterized in that the phase discriminators (3,8) are coupled to the low-pass filter (4) via an alternating switch (12).

11. A circuit arrangement as claimed in claim 2, characterized in that the phase discriminators (3,8) are coupled to the low-pass filter (4) via an alternating switch (12).

12. A circuit arrangement as claimed in claim 2, characterized in that the phase discriminators (3,8) are coupled to the low-pass filter (4) via an alternating switch (12).

13. A circuit arrangement as claimed in claim 12, characterized in that the output of the oscillator (5) is coupled to an input of an auxiliary frequency dividers whose output is coupled to the inputs of the frequency dividers (6,9).

14. A circuit arrangement as claimed in claim 11, characterized in that the output of the oscillator (5) is coupled to an input of an auxiliary frequency divider (15) whose output is coupled to the inputs of the frequency dividers (6,9).

15. A circuit arrangement as claimed in claim 10, characterized in that the output of the oscillator (5) is coupled to an input of an auxiliary frequency divider (15) whose output is coupled to the inputs of the frequency dividers (6,9).

16. A circuit arrangement as claimed in claim 9, characterized in that the output of the oscillator (5) is coupled to an input of an auxiliary frequency divider (15) whose output is coupled to the inputs of the frequency dividers (6,9).

17. A circuit arrangement as claimed in claim 5, characterized in that the output of the oscillator (5) is coupled to an input of an auxiliary frequency divider (15) whose output is coupled to the inputs of the frequency dividers (6,9).

18. A circuit arrangement as claimed in claim 4, characterized in that the output of the oscillator (5) is coupled to an input of an auxiliary frequency divider (15) whose output is coupled to the inputs of the frequency dividers (6,9).

19. A circuit arrangement as claimed in claim 3, characterized in that the output of the oscillator (5) is coupled to an input of an auxiliary frequency divider (15) whose output is coupled to the inputs of the frequency dividers (6,9).

20. A circuit arrangement as claimed in claim 2, characterized in that the output of the oscillator (5) is coupled to an input of an auxiliary frequency divider (15) whose output is coupled to the inputs of the frequency dividers (6,9).

* * * * *